(12) United States Patent
Spalink

(10) Patent No.: US 7,995,690 B2
(45) Date of Patent: Aug. 9, 2011

(54) DIGITAL FILTER

(75) Inventor: Gerd Spalink, Stuttgart (DE)

(73) Assignee: Sony Deutschland GmbH, Berlin (DE)

(*) Notice: Subject to any disclaimer, the term of this patent is extended or adjusted under 35 U.S.C. 154(b) by 735 days.

(21) Appl. No.: 12/032,129

(22) Filed: Feb. 15, 2008

(65) Prior Publication Data

US 2008/0240317 A1 Oct. 2, 2008

(30) Foreign Application Priority Data

Mar. 31, 2007 (EP) .................................. 07006800

(51) Int. Cl.
*H04B 1/10* (2006.01)
(52) U.S. Cl. ...................................................... 375/350
(58) Field of Classification Search .......... 375/229–236, 375/350; 333/18, 28 R; 708/300, 322, 323; 379/340, 398
See application file for complete search history.

(56) References Cited

U.S. PATENT DOCUMENTS

| | | | |
|---|---|---|---|
| 2005/0013353 A1* | 1/2005 | Alloin | 375/222 |
| 2006/0019604 A1* | 1/2006 | Hasarchi | 455/15 |
| 2006/0290819 A1* | 12/2006 | Benjebbour et al. | 348/678 |
| 2007/0189419 A1* | 8/2007 | Filipovic | 375/324 |

FOREIGN PATENT DOCUMENTS

| | | |
|---|---|---|
| EP | 1 160 978 A1 | 12/2001 |
| EP | 1 696 563 A1 | 8/2006 |
| WO | WO 2005/004499 A2 | 1/2005 |

OTHER PUBLICATIONS

U.S. Appl. No. 12/039,250, filed Feb. 28, 2008, Spalink, et al.

* cited by examiner

*Primary Examiner* — Sam K Ahn
(74) *Attorney, Agent, or Firm* — Oblon, Spivak, McClelland, Maier & Neustadt, L.L.P.

(57) ABSTRACT

Digital filter (104), comprising: a first frequency shifting mechanism (106) configured to shift an input spectrum (H(f)) of an input signal (100) by a first frequency distance (F1) to obtain a shifted frequency signal (122) with a shifted spectrum; a filter (108), configured to filter said shifted frequency signal with a predetermined transfer function to obtain a filtered signal (130); and a signal processor (110), said signal processor including: an adder (202), and at least a second frequency shifting mechanism (222), said signal processor (110) being configured to generate an output signal (140), which is a sum of said filtered signal (130) and said shifted frequency signal (122) and said output signal (140) has an output spectrum, which is shifted by a second frequency distance (DF) with respect to said shifted spectrum, wherein said second frequency distance (DF) is independent of said first frequency distance (F1).

13 Claims, 7 Drawing Sheets

DIGITAL FILTER

The invention relates to a digital filter. The invention also relates to a method of filtering an input signal.

BACKGROUND

Communication receivers often need to suppress narrow-band signals, either because of disturbing signals within this narrow-band or because the narrow-band signal is not needed for the next processing steps within the communication receiver. For such receivers a good selectivity at low implementation cost is wanted.

It is therefore an object of the invention to provide a digital filter with good selectivity at low implementation cost, which can be used within such a communication receiver.

The object is solved by a digital filter according to claim 1. Further embodiments are defined in the dependent claims.

Further details of the invention will become apparent from a consideration of the drawings and ensuing description.

DETAILED DESCRIPTION

In the following, embodiments of the invention are described. It is important to note, that all described embodiments in the following may be combined in any way, i.e. there is no limitation that certain described embodiments may not be combined with others.

Figure 1A:
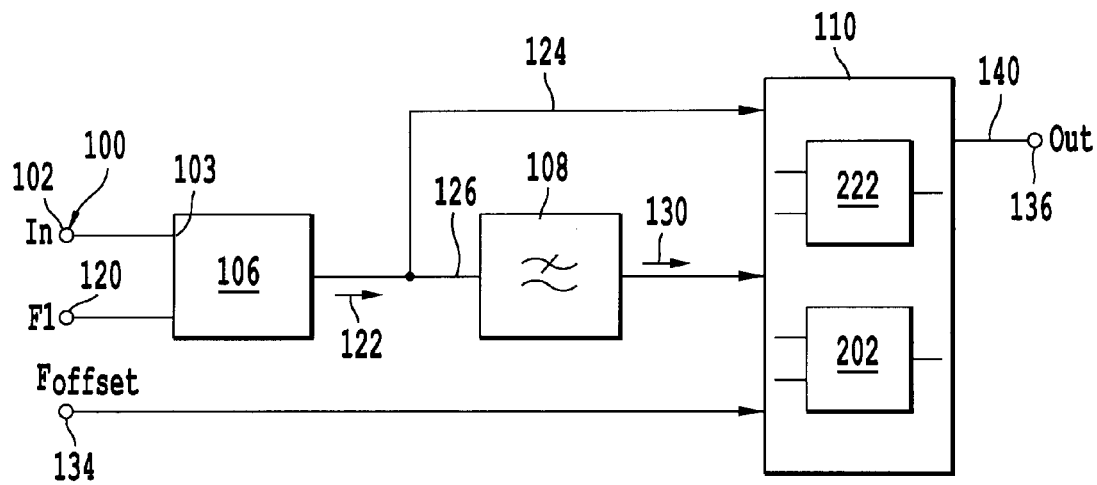
FIG. 1a shows an embodiment of the digital filter.

In FIG. 1a, an input signal 100 is coupled into an input 102 of a digital filter 104. The digital filter comprises a first frequency shifting mechanism 106, a filter 108, and a signal processor 110. The first frequency shifting mechanism 106 shifts an input spectrum of the input signal 100 by a first frequency difference F1, which can be coupled into a second input 120 of said first frequency shifting mechanism 106. The first frequency shifting mechanism 106 generates a shifted frequency signal 122, which has a shifted spectrum, shifted by the first frequency difference F1 with respect to the input spectrum. The shifted frequency signal 122 is coupled via a first signal path 124 to an input of the signal processor 110 and via a second signal path 126 to a filter 108. The filter 108 is used for filtering the shifted frequency signal 122. Within applications, where certain parts of the input signal 100 should be notched, i.e. filtered out, the filter 108 is build as a low pass filter, and the first frequency shifting mechanism 106 shifts the input spectrum of the input signal 100 so that the frequency range, which should be filtered out by the filter 108, is situated approximately around zero.

For instance, on the second signal path 126 after the filter 108 there is only the part of the input signal 100 present, which should be filtered out from the input signal 100. The first signal path 124 and the second signal path 126 are connected to inputs of a signal processor 110, which comprises at least one second frequency shifting mechanism 22 and an adder 202, wherein said adder 202 is configured to add signals, which are present at inputs of said adder 202 and said at least one further frequency shifting mechanism 222 is configured to shift the spectrum of a signal on an input of said at least one further frequency shifting mechanism 222 by a second frequency distance DF, which second frequency distance DF is independent of said first frequency difference F1.

Within this description an adder might also be used to subtract signals by using a negative input. A signal on a negative input is actually subtracted from a signal on a positive input of said adder.

To achieve this independency the signal processor 110 comprises a further input 134 for a frequency offset Foffset, which frequency offset Foffset is descriptive of a difference between said first frequency difference F1 and said second frequency difference DF.

At the output 136 of said signal processor 110 an output signal 140 is generated, which is a combination of the shifted signal 122 on the first path 124 and the filtered signal 130 on the second path 126, said output signal having an output spectrum, which is shifted compared to the spectrum of the shifted frequency signal 122.

Figure 1B:
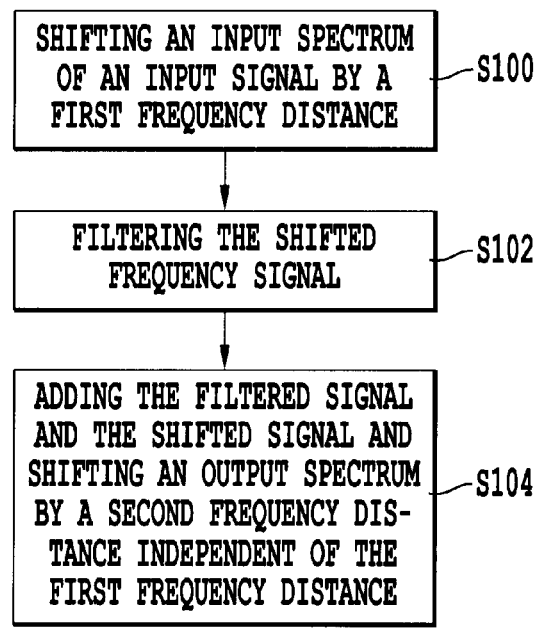
FIG. 1b shows an embodiment of a method for filtering an input signal.

In FIG. 1b an embodiment of a method for filtering an input signal is depicted.

In a first step S100 the input spectrum of the input signal is shifted by the first frequency distance F1 to obtain the shifted frequency signal. For instance the input spectrum is shifted versus a lower frequency range, in which it is easier realize a filter for filtering and further processing the input signal.

In a second step S102 the shifted frequency signal is filtered, e.g. by a digital filter. The obtained filtered signal may be a signal, which afterwards is intended to be subtracted from the shifted frequency signal. The obtained filtered signal might be as well used for separately demodulating said filtered signal in a further processing step.

In a third step S104 the filtered signal and the shifted frequency signal are added and the output spectrum is shifted by the second frequency distance, which is independent of said first frequency distance. So the output spectrum may be situated in another frequency range than the input spectrum.

Figure 1C:
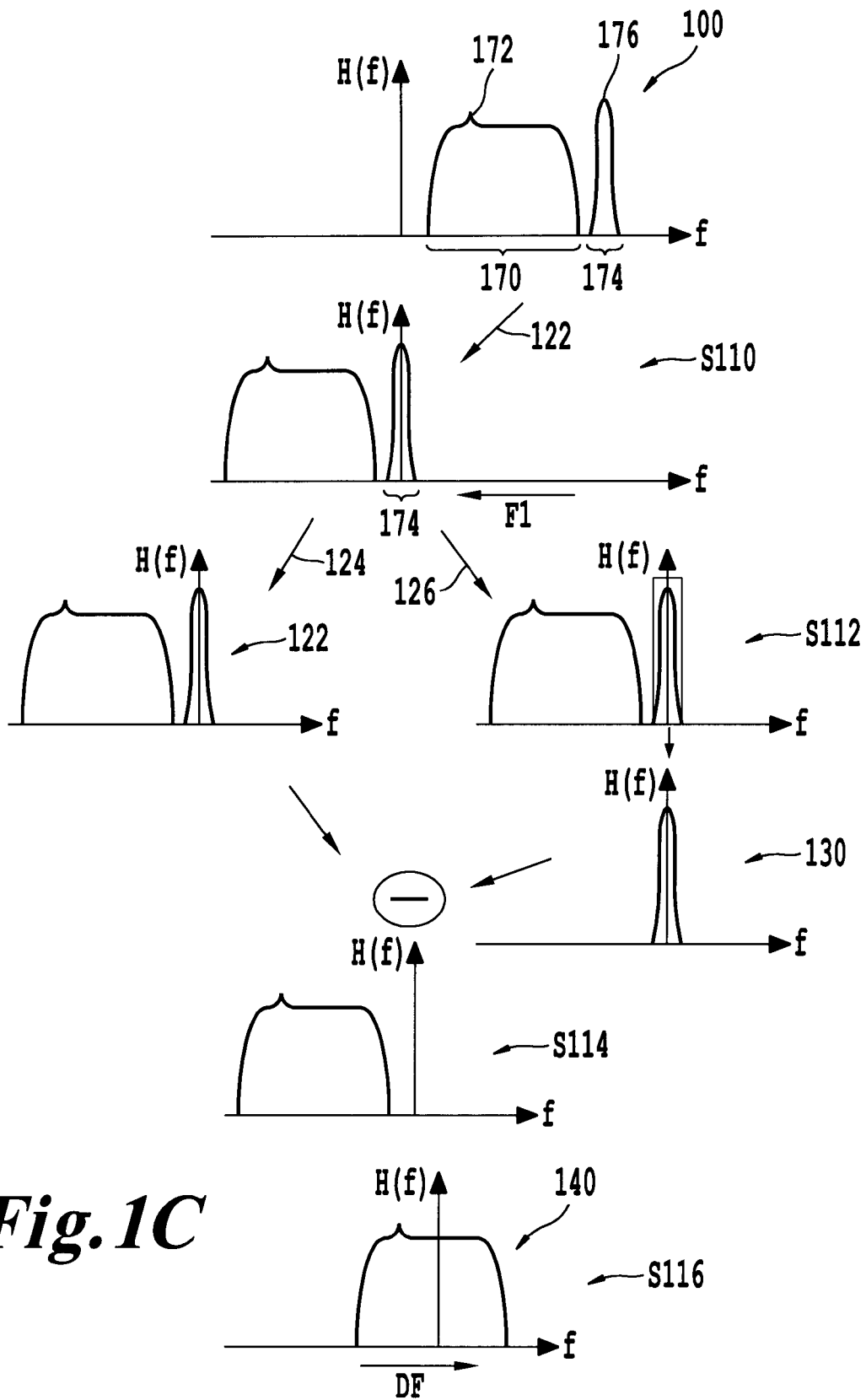
FIG. 1c shows a further embodiment of a method for filtering an input signal.

In FIG. 1c a further embodiment of a method for filtering an input signal is depicted by showing frequency diagrams of an analogue television signal as input signal 100. The analogue television signal 100 comprises a video signal 170 in vestigial side band modulation with a video carrier 172 and a sound signal 174 with a sound carrier 176.

In a step S110 the input spectrum of the input signal 100 is shifted towards a lower frequency range by a frequency distance F1, which in this embodiment corresponds to the frequency of the sound carrier 176, so that the sound signal 174 is centered around the frequency 0.

In a further step S112 the sound signal 174 is filtered by the use of a transfer function 150, which is centered around frequency 0. Low-pass digital filters with such transfer function 150 are easy to realize and a filtered signal 130 is obtained afterwards.

By subtracting the filtered signal 130 from the shifted frequency signal 122 in a further step S114, e.g. by inputting the filtered signal 130 in a negative input of the adder 202 and the shifted frequency signal on the positive input of the adder 202, an intermediate signal 160 is obtained, which only comprises the video signal 170 shifted by said first frequency distance F1 from its original position.

In a further step S116 said video signal is shifted a second frequency distance DF with respect to the intermediate signal 160, said second frequency distance DF being independent from said first frequency distance F1. So the video signal 170 can now be centered around frequency 0 for efficient further processing.

Figure 1D:
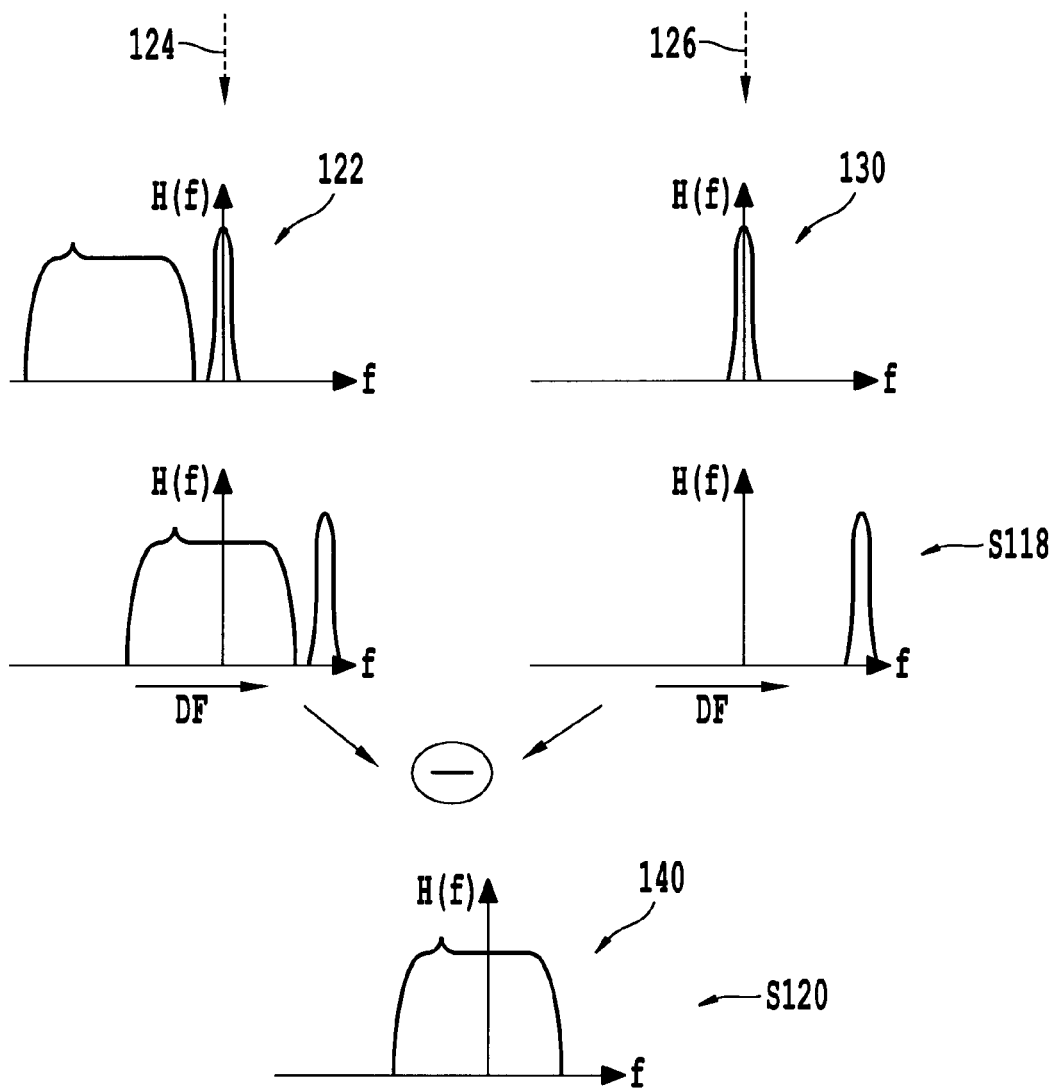
FIG. 1d shows a further embodiment of a method for filtering an input signal.

In FIG. 1d a further embodiment of a method for filtering an input signal 100 is depicted. The steps S110 and S112 are the same as in FIG. 1c and are not depicted in FIG. 1d, which starts with the results after the filtering step. In a further step S118 the frequency shifted signal and the filtered signal are shifted by the second frequency distance DF and afterwards in a further step S120 the shifted frequency signal is added to the inverse filtered and shifted signal, so that the an output signal 140 is obtained, without the sound signal 174 and which output signal 140 is centered around frequency 0.

Therefore, the independency of the first frequency distance F1 and the second frequency distance DF might be used, e.g. for centering the output signal 140 around another center frequency than the input signal 100. It may be used, e.g. for centering an analog television signal, after having notched the sound signal 174 with the help of the filter 108.

Figure 2:
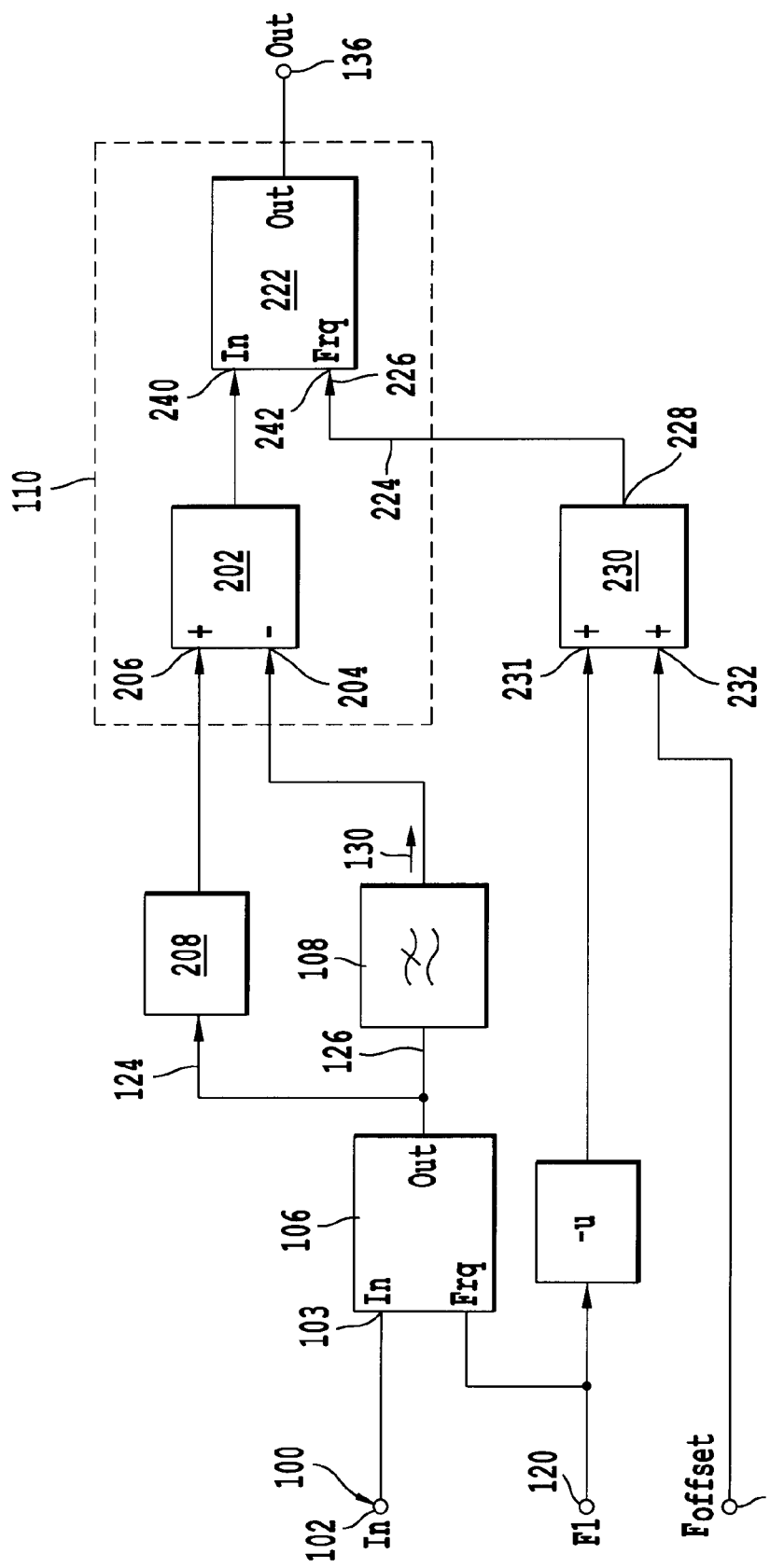
FIG. 2 shows a further embodiment of the digital filter.

In a further embodiment, depicted in FIG. 2, the adder 202 of the signal processor 110 is connected to the first path 124 and to the second path 126 with its outputs. The filtered signal 130 is input into an input 204 of the adder 202 with a negative sign, whereas the first path 124 is connected to an input 206 with a positive sign. In the first path 124 a delay element 208 is provided, for compensating a delay resulting from the filter 108. At the output 210 of the adder 202 a signal 220 is present, which has the spectrum of the input signal 100 minus the filtered signal 130. The output 210 of the adder 202 is coupled to an input of the second frequency shifting mechanism 222, which shifts the spectrum of the signal 220 by the second frequency difference DF, which is independent of the first frequency difference F1. This is achieved by applying a shifting frequency 224 at a second input 226 of said second frequency shifting mechanism 222, which shifting frequency is obtained as an output 228 of a second adder 230, which on its inputs has a frequency offset Foffset and the inverse first frequency difference F1.

According to a further embodiment the second path further comprises a decimator and an interpolator, so that the filter 108 may be realized at a lower sampling rate and with a lower calculation effort.

Figure 3:
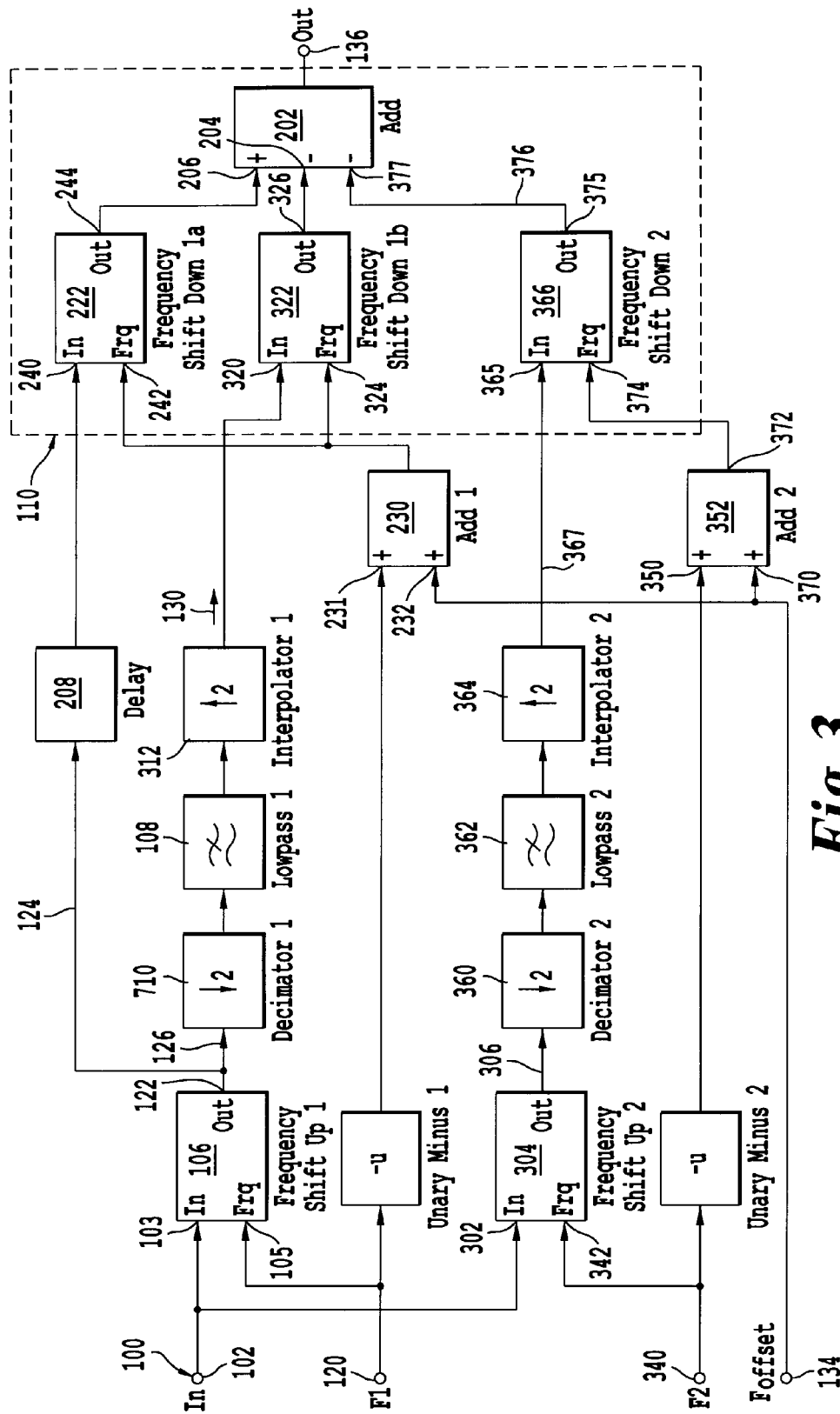
FIG. 3 shows a further embodiment of a digital filter.

In a further embodiment a further path is provided for notching further frequency ranges from the input signal 100. Such an embodiment is depicted in FIG. 3. The input signal 100 is coupled into an input 102 and is connected to an input 103 of the first frequency shifting mechanism 106. The input 102 is also connected to an input 302 of an additional frequency shifting mechanism 304. The spectrum of the input signal 100 is shifted in the first frequency shifting mechanism 106 by a first predetermined frequency difference F1 which is input into a second input 105 of the first frequency shifting mechanism 106.

The shifted frequency signal 130 is coupled into a first path 124 via a delay element 208 to the first input 240 of the second frequency shifting mechanism 222. The shifted frequency signal 126 is also input into a decimator 310 on the second path 126. The output of the decimator 310 is connected to an input of the filter 108, which output is connected to an input of an interpolator 312.

The decimator 310 and the interpolator 312 are used to reduce the sampling rate of the shifted frequency signal 122 in order to decrease the calculation effort within the filter 108.

The filtered signal 130 is input into a first input 320 of a third frequency shifting mechanism 322. The frequency shift of the second frequency shifting mechanism 222 and the third frequency shifting mechanism 322 is determined by an output of a second adder 230 which is connected to a second input 242 of the first frequency shifting mechanism 222 and to a second input 324 of the third frequency shifting mechanism 322.

The inputs 231, 232 of the second adder 230 are connected to an input 134 of the frequency offset Foffset and to the input 120, where the first frequency difference F1 is input.

An output 244 of the second frequency shifting mechanism 222 is connected to a first input 206 of the adder 202. An output 326 of the third frequency shifting mechanism 322 is connected to the second input 204 of the adder 202 with a negative sign.

With this embodiment as well there is an output signal 140 at the output 136 of the signal processor 110, where the filtered signal 130 has been filtered out of the input signal 100 and the spectrum of the input signal 100 has been shifted arbitrarily by the offset frequency Foffset.

Within the embodiment depicted in FIG. 3 there is also the possibility to notch a further frequency range centered around a third frequency F2, which is inputted into a third input 340. The third frequency F2 is thereby inputted into a second input 342 of a fourth frequency shifting mechanism 304 and is input into a first input 350 of a third adder 352.

In the fourth frequency shifting mechanism 304 the spectrum of the input signal 100 is shifted by a third predetermined frequency distance F2 and inputted into a second decimator 360, afterwards filtered by a second filter 362 and interpolated by a second interpolator 364, which output is connected to a fifth frequency shifting mechanism 366.

The offset frequency Foffset is also connected to a second input 370 of the third adder 352. The output 372 of the third adder 352 is connected with a second input of the fifth frequency shifting mechanism 366. In this fifth frequency shifting mechanism 366 a second filtered signal 367 after passing the second filter 362 is shifted by a fourth frequency difference, resulting as a sum of the offset frequency Foffset and the third predetermined frequency difference F2.

At an output 375 of the fifth frequency shifting mechanism 366 the resulting frequency shifted filtered signal 376 is obtained and input into a third input 377 of the adder 202 with a negative sign. At the output 136 a signal is obtained where two signals are notched from the input signal 100, and the output spectrum has been arbitrarily shifted with respect to the input spectrum of the input signal 100.

In a further embodiment a digital filter is provided, wherein the decimator 310, 360 and the interpolator 312, 364 are realized together in one signal processing mechanism, said signal processing mechanism including a second digital filter and two inputs and two outputs, wherein one of the two inputs and one of the two outputs are used as input and output of a decimator function of the signal processing mechanism and the other input and the other output are used as input and output of an interpolator function of the signal processing mechanism. With this embodiment only one digital filter is used to realize the decimator and the interpolator function, which is used before and after the filter of the described digital filter.

Figure 4:
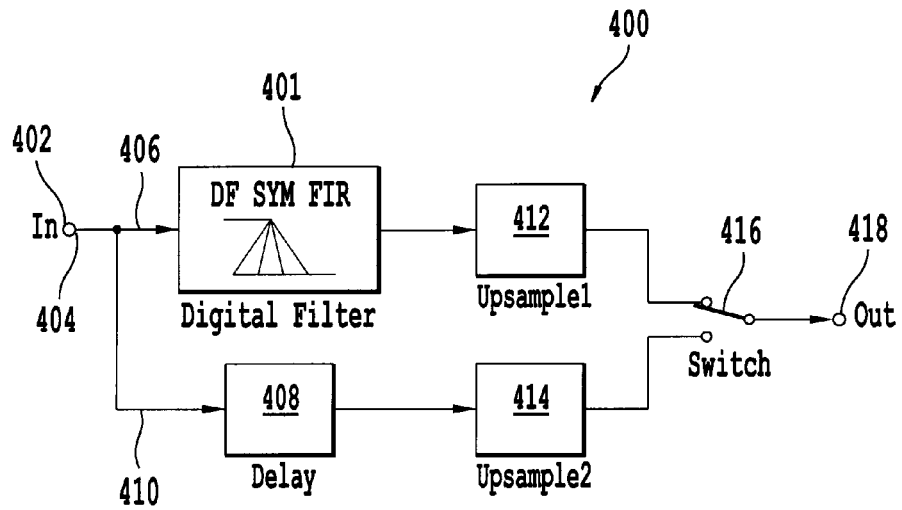
FIG. 4 shows a decimator with a half-band digital filter according to the prior art.

In FIG. 4 a prior art decimator 400 based on a half-band digital filter 401, e.g. a half-band FIR-filter, is depicted. A signal 402 at an input 404 of the decimator 400 is input into the digital filter 401 on a first path 406 and input into a delay element 408 at a second path 410. The output of the digital filter 401 is upsampled by a first upsampling unit 412 and the output of the delay element 408 is upsampled by a second upsampling element 414. The first path 406 and the second path 410 afterwards are combined via a switch 416 which changes between the first path 406 and the second path 410, so that at the output 418 a decimated signal is obtained.

Figure 5:
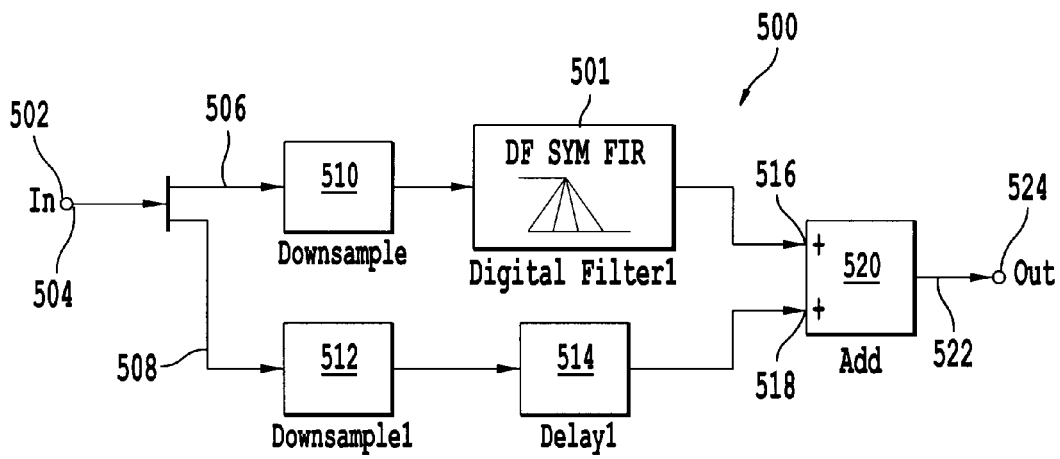
FIG. 5 shows an interpolator using a digital half-band filter according to the prior art.

In FIG. 5 an interpolator 500 is depicted, which is realized by a half-band filter, 501, e.g. a half-band FIR-filter. An input signal 502 which is inputted into an input 504 is divided into a first path 506 and a second path 508. The signal on the first path 506 is downsampled by a first downsampling unit 510 and input into the digital filter 501, which is realized as a half-band filter. The signal on the second path 508 is downsampled by a second downsampling unit 512 and input into a delay unit 514. Outputs of the digital filter 501 and the delay unit 514 are input into inputs 516 and 518 of an adder 520 respectively. At the output of the adder 520 an interpolated signal 524 is obtained.

Figure 6:
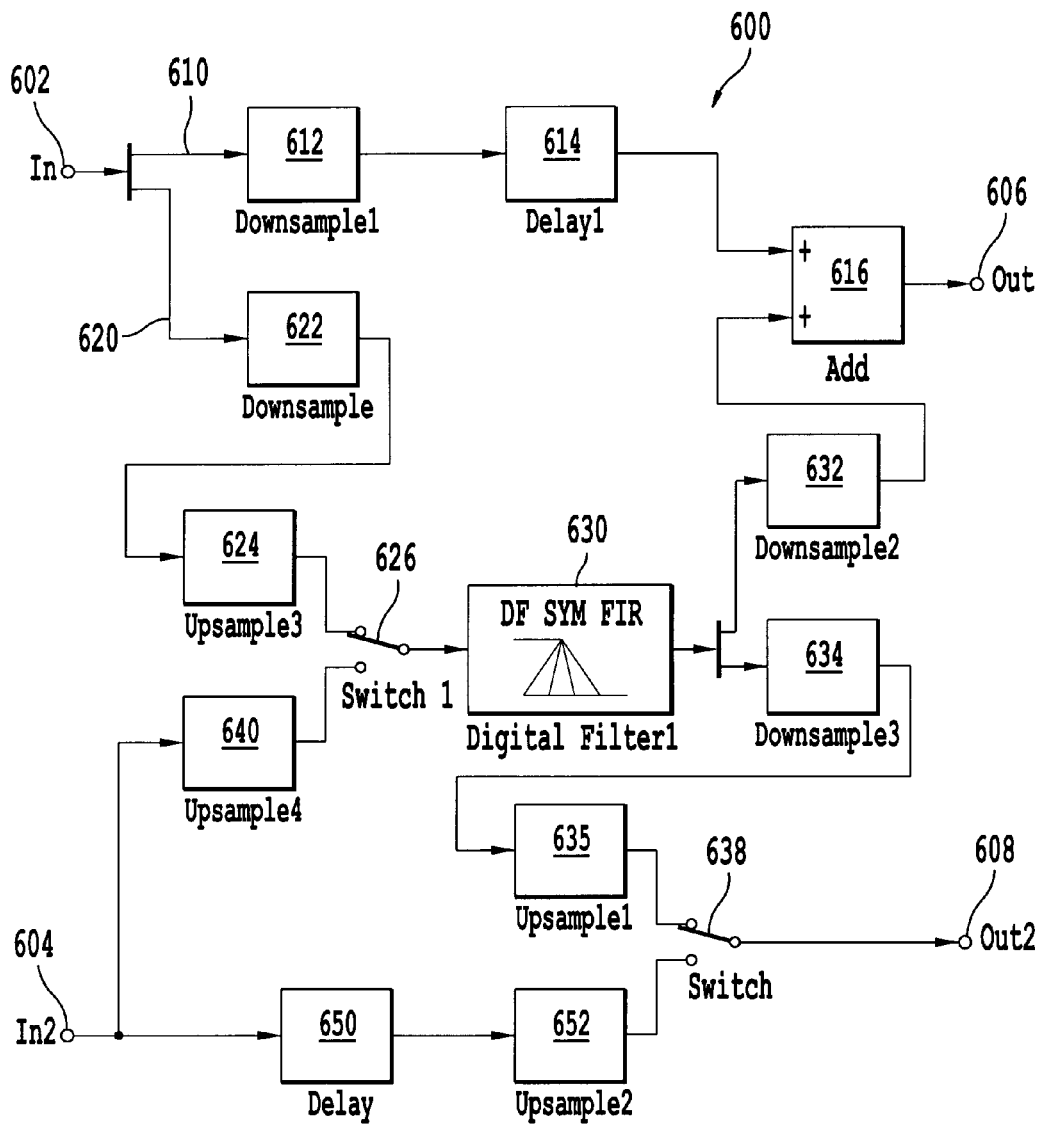
FIG. 6 shows an embodiment of signal processing mechanism comprising an interpolator and a decimator function.

In FIG. 6 an embodiment of a signal processing mechanism 600 for combining a decimator function and an interpolator function is depicted. The signal processing mechanism 600 comprises a first input 602, a second input 604, a first output 606 and a second output 608. The first input 602 is connected to a first path 610 and a second path 620.

A signal on the first path 610 is input into a third down-sampling unit 612, which comprises an output, which is connected to an input of a delay unit 614. The output of the delay unit 614 is connected to an input of an adder 616. An output of the adder 616 is connected to the first output 606. This first path 610 corresponds to the first path 506 of the interpolator shown in FIG. 5. The signal on the second path 620 is connected to a second downsampling unit 622. An output of the second downsampling unit 622 is connected to a first upsampling unit 624. The upsampling unit 624 is connected to the second digital filter 630 via a first switch 626.

The output of the digital filter 630 is connected via a third down-sampling unit 632 to the second input of the adder 616 and via a fourth downsampling unit 634 and a second upsampling unit 635 and a second switch 638 to the second output 608.

The second input 604 is connected to an input of a third upsampling unit 640. An output of said upsampling unit 640 is connected to the first switch 626. The second input 604 is connected as well to an input of delay unit 650, which output is connected to a fourth upsampling unit 652, which output is connected to the second switch 638.

With this structure 600 there is only one digital filter 630 which acts in a decimator function and interpolator function. With an appropriate switching of the first switch 626 and the second switch 638 as well as an appropriate adjustment of the first upsampling unit 624, the third downsampling unit 632 and the fourth upsampling unit 640 the clock rate within the second digital filter 630, which is four times the clock rate after the second downsampling unit 622, can be used to implement a decimator and interpolator function within said signal processing mechanism 600.

Similar to serially multiplexing real and imaginary parts through a single filter implementation, the signal to be decimated and the signal to be interpolated can be sent through the same single filter implementation, i.e. the second digital filter 630. So the single filter 630 with possibly only a single multiplier can be used to implement one decimator and one interpolator.

If a serial multiplex in the digital filter 630, e.g. a half-band FIR-filter, has four components (real/decimator, imag/decimator, real/interpolator, imag/interpolator), then the filter delay elements (not depicted) may store four samples. The clock for the filter delay elements and for the multiplier of the second digital filter 630 may be four times the sample rate of the signal processing mechanism 600. In this way a resource sharing is achieved.

The frequency shifting mechanisms might be realized by applying a CORDIC algorithm.

Within the figures a decimation and interpolation of factor 2 is depicted, however, if the signal to be suppressed is more narrow-band, the interpolation and decimation factors could be chosen to be higher than 2, e.g. 4 or 8. These higher factors might be implemented by cascading several decimators/interpolators.

More spectral region might be suppressed by adding more filter paths, a duplication of the delay element is not necessary.

The invention claimed is:

1. A digital filter, comprising:
  a first frequency shifting mechanism configured to shift an input spectrum of an input signal by a first frequency distance to obtain a shifted frequency signal with a shifted spectrum;
  a filter, configured to filter said shifted frequency signal with a predetermined transfer function to obtain a filtered signal; and
  a signal processor, said signal processor including:
    an adder, and
    at least a second frequency shifting mechanism, said signal processor being configured to generate an output signal, which is a sum of said filtered signal and said shifted frequency signal and said output signal has an output spectrum, which is shifted by a second frequency distance with respect to said shifted spectrum, wherein said second frequency distance is independent of said first frequency distance.

2. A digital filter according to claim 1, wherein one input of said adder is connected to an output of said filter and another input of said adder is connected to an output of said first frequency shifting mechanism and wherein an input of said second frequency shifting mechanism is connected to said output of said adder.

3. A digital filter comprising:
  a first frequency shifting mechanism configured to shift an input spectrum of an input signal by a first frequency distance to obtain a shifted frequency signal with a shifted spectrum;
  a filter configured to filter said shifted frequency signal with a predetermined transfer function to obtain a filtered signal;
  a signal processor;
  a delay element between said first frequency mechanism and said signal processor, said delay element being configured to adjust said shifted frequency signal in order to compensate for the delay within said filter; wherein the signal processor includes:
    an adder, and
    at least a second frequency shifting mechanism configured to shift the adjusted shifted frequency signal by a second frequency distance, which is independent of the first frequency distance, and wherein
  said signal processor further includes a third frequency shifting mechanism configured to shift a filtered spectrum of said filtered signal by said second frequency distance, and wherein an input of said second frequency shifting mechanism is connected to an output of said delay element, and wherein an input of said third frequency shifting mechanism is connected to an output of said filter and wherein an output of said second frequency shifting mechanism is connected to an input of said adder and wherein an output of said third frequency shifting mechanism is connected to another input of said adder.

4. A digital filter according to claim 3, further comprising:
a decimator between said first frequency shifting mechanism and said filter; and
an interpolator between said filter and said signal processor.

5. A digital filter according to claim 3, further comprising:
a fourth frequency shifting mechanism configured to shift said input spectrum by a third frequency distance to obtain a second frequency shifted signal;
a second filter with a predetermined second transfer function to obtain a second filtered signal with a second filtered spectrum, an input of said second filter being connected to an output of said fourth frequency shifting mechanism;
a fifth frequency shifting mechanism, configured to shift said second filtered spectrum by a fourth frequency distance, wherein an output of said fifth frequency shifting mechanism is connected to a further input of said adder.

6. A digital filter according to claim 3, further comprising:
an input for an arbitrary offset frequency which offset frequency is descriptive of the difference between said first frequency distance and said second frequency distance.

7. A digital filter according to claim 4, wherein said decimator and said interpolator are realized together in one signal processing mechanism, said signal processing mechanism including a second digital filter and two inputs and two outputs, wherein one of the two inputs and one of the two outputs are used as input and output of a decimator function and the other input and the other output are used as input and output of an interpolator function.

8. A digital filter according to claim 7, wherein said signal processing mechanism further includes at least one switch to change between said decimator function and said interpolator function.

9. A digital filter according to claim 7, wherein said second digital filter is a half-band filter.

10. A method for filtering an input signal, comprising:
generating a shifted frequency signal by a first frequency shifting mechanism by shifting an input spectrum of said input signal by a first frequency distance;
filtering said shifted frequency signal by a filter to obtain a filtered signal;
generating an output signal by a signal processor by adding said filtered signal and said shifted frequency signal and by shifting an output spectrum of said output signal by a second frequency distance, which is independent of said first frequency distance.

11. A method according to claim 10, wherein during said generating an output signal said filtered signal and said shifted frequency signal are first added by an adder before the output spectrum is shifted.

12. Method according to claim 10, wherein during said step of generating an output signal said shifted frequency signal and said filtered signal are shifted before said step of adding by an adder.

13. A method for filtering an input signal, comprising:
generating a shifted frequency signal by a first frequency shifting mechanism by shifting an input spectrum of said input signal by a first frequency distance;
filtering said shifted frequency signal by a filter to obtain a filtered signal;
delaying by a delay element said shifted frequency signal by a time corresponding to a group delay of said filter before adding it to said filtered signal
generating an output signal by a signal processor by adding said filtered signal and said delayed and shifted frequency signal and by shifting an output spectrum of said output signal by a second frequency distance, which is independent of said first frequency distance.

* * * * *